United States Patent
McKiernan et al.

(10) Patent No.: US 10,409,321 B2
(45) Date of Patent: Sep. 10, 2019

(54) SIMULATION SYSTEM WITH CLOCK AND MESSAGING SYNCHRONIZATION

(71) Applicant: Raytheon Company, Waltham, MA (US)

(72) Inventors: Terence J. McKiernan, Rancho Palos Verdes, CA (US); Ray B. Huffaker, Redondo Beach, CA (US); Daniel G. Miller, Torrance, CA (US); David A. Blaser, Los Angeles, CA (US); Ryan D. Retting, Torrance, CA (US); Harry B. Marr, Manhattan Beach, CA (US)

(73) Assignee: Raytheon Company, Waltham, MA (US)

( * ) Notice: Subject to any disclaimer, the term of this patent is extended or adjusted under 35 U.S.C. 154(b) by 211 days.

(21) Appl. No.: 15/423,829

(22) Filed: Feb. 3, 2017

(65) Prior Publication Data

US 2018/0224883 A1    Aug. 9, 2018

(51) Int. Cl.
    *G06F 1/12*      (2006.01)
    *G06F 9/54*      (2006.01)
    *G06F 17/50*      (2006.01)

(52) U.S. Cl.
    CPC .............. *G06F 1/12* (2013.01); *G06F 9/546* (2013.01); *G06F 17/5022* (2013.01); *G06F 2217/62* (2013.01)

(58) Field of Classification Search
None
See application file for complete search history.

(56) References Cited

U.S. PATENT DOCUMENTS

| | | | |
|---|---|---|---|
| 6,117,181 A * | 9/2000 | Dearth | G06F 17/5022 703/22 |
| 6,560,572 B1 | 5/2003 | Balaram et al. | |
| 7,117,139 B2 | 10/2006 | Bian | |
| 7,203,632 B2 | 4/2007 | Milne et al. | |
| 7,319,947 B1 * | 1/2008 | Khaira | G06F 17/5022 703/17 |
| 7,418,681 B2 | 8/2008 | Takei | |
| 7,617,084 B1 | 11/2009 | Koslow et al. | |
| 8,234,624 B2 | 7/2012 | Devins et al. | |

(Continued)

FOREIGN PATENT DOCUMENTS

| | | |
|---|---|---|
| EP | 2 299 376 A1 | 3/2011 |
| WO | WO 02/08966 A2 | 1/2002 |

OTHER PUBLICATIONS

Caldwell et al.; "Optimizing Simulation Speed of FPGA Model Based Synthesis"; Raytheon Space and Airborne Systems; IEEE HPEC conference in Boston; Sep. 2016; 7 pages.

*Primary Examiner* — Danny Chan
(74) *Attorney, Agent, or Firm* — Daly, Crowley, Mofford & Durkee, LLP

(57) ABSTRACT

A system includes a first simulated processing system having a first clock and a second simulated processing system having a second clock. The first and second processing systems may operate asynchronously. A synchronization bridge may coordinate executing of the first synchronized processing system and the second synchronized processing system to synchronize the time of execution of the first and second simulated processing systems and messaging between the first and second processing systems. The first and second processing systems may be simulated processing systems.

34 Claims, 5 Drawing Sheets

(56) References Cited

U.S. PATENT DOCUMENTS

| | | | |
|---|---|---|---|
| 8,352,231 B2 | 1/2013 | Babinsky et al. | |
| 9,813,226 B2* | 11/2017 | Bergeron | H04L 7/0012 |
| 2003/0069723 A1 | 4/2003 | Hegde | |
| 2004/0267512 A1* | 12/2004 | Hintikka | G06F 17/5022 |
| | | | 703/16 |
| 2006/0248367 A1* | 11/2006 | Fischer | G06F 1/12 |
| | | | 713/401 |
| 2007/0033511 A1* | 2/2007 | Davies | G06F 11/1675 |
| | | | 714/799 |
| 2012/0084062 A1* | 4/2012 | Maturana | G06F 17/5022 |
| | | | 703/6 |
| 2016/0127990 A1* | 5/2016 | Elsayed | H04W 52/0209 |
| | | | 370/311 |
| 2016/0192311 A1* | 6/2016 | Tender | H04W 56/0055 |
| | | | 370/316 |

\* cited by examiner

US 10,409,321 B2

SIMULATION SYSTEM WITH CLOCK AND MESSAGING SYNCHRONIZATION

FIELD

This disclosure relates to software systems integration and, more particularly, to time and messaging synchronization between two asynchronous simulation systems.

BACKGROUND

During development, simulated hardware and software systems can aid in the design, test, and debugging processes. Simulated systems can give engineers insight into how the real-world system will perform, and allow designers to redesign, revise, and fix errors in the system before it is implemented in production hardware or software. Doing so can drastically reduce the cost of development.

Sometimes, one hardware or software system needs to communicate with another hardware or software system in real time. However, if these two systems are simulated on different platforms which provide more or less processing power than the real-time systems they simulate, the simulations may run at different clock speeds. Assume, for example, one simulation is executing on a simulation platform that runs at 2× the speed of the real-time system, and another is executing on a simulation platform that runs at 0.5× the speed of the real-world system. Communication between these two systems during simulation may not work because of the time discrepancy. For example, since the systems run at different clock speeds, logic that relies on the specific timing and sequencing of messages between the systems may not work properly. Similarly, normal system development activities such as using diagnostic tools or debuggers may vary the clock speed of the simulated systems, also causing mismatches vs. the expecting timing and sequencing and leading to failures. Thus, it may be very difficult to design and test the interface between the two systems in the simulated environment, reducing the benefits of the simulated environment and making the overall system development more difficult and costly.

SUMMARY

In an embodiment, a system includes a first simulated processing system having a first clock and a second simulated processing system having a second clock. The first and second processing systems may operate asynchronously. A synchronization bridge may coordinate executing of the first synchronized processing system and the second synchronized processing system to synchronize the time of execution of the first and second simulated processing systems.

One or more of the following features may be included.

The synchronization bridge may receive, from the first simulated processing system, an amount of time of execution of the first processing system. The synchronization bridge may be configured to instruct the second simulated processing system to run for at least the amount of time received from the first processing system. The system may be further configured to determine an amount of time associated with a number of clock cycles executed by the first processing system. The system may be configured to determine a second number of clock cycles of the second clock associated with the determined amount of time.

The synchronization bridge may be configured to receive a message from the first and/or second simulated processing system directed to the other simulated processing system. The synchronization bridge may be configured to receive, from the first and/or second simulated processing system, a message indicating whether the first and/or second simulated processing system is running or idle. On receipt of the message indicating that the first simulated processing system is idle, the synchronization bridge may be configured to instruct the second processing system to run, and on receipt of the message indicating that the second simulated processing system is idle, the synchronization bridge may be configured to instruct the first processing system to run.

The first simulated processing system, the second simulated processing system, and the synchronization bridge may run on a common computing system.

The system may include a simulation toggle that selectively causes at least one of the first and the second simulated processing systems to run in a low-fidelity mode or a high-fidelity mode.

In another embodiment, a method for time synchronization of asynchronously running processing systems includes executing, by one or more computing devices, a first simulated processing system having a first simulated clock for a first number of clock cycles of the first simulated clock; and executing, by the one or more computing devices, a second simulated processing system having a second simulated clock for a second number of clock cycles of the second simulated clock. The first number of clock cycles of the first simulated clock and the second number of clock cycles of the second simulated clock correspond to a common execution time.

One or more of the following features may be included.

The execution of the first and second simulated processing systems may be controlled by a synchronization bridge executed by the computing system. The synchronization bridge may determine the execution time based on the first number of clock cycles of the first simulated processing system. The synchronization bridge may determine the second number of clock cycles of the second clock associated with the execution time. The synchronization bridge may instruct the second simulated processing system to run for at least the second number of clock cycles.

The synchronization bridge may receive a message from the first and/or second simulated processing system indicating that the first and/or second processing system is running; receive a message form the first and/or second simulated processing system indicating that the first and/or second simulated processing system is idle; instruct the second processing system to run in response to receiving the message indicating that the first simulated processing system is idle; and instruct the first processing system to run in response to receiving the message indicating that the second simulated processing system is idle.

In another embodiment, a synchronization bridge for synchronizing executing between two processing systems includes: a time synchronization bridge coupled to a first processing system and a second processing system, and configured to halt and start execution of the first and second processing systems to maintain time synchronization between the first and second processing systems; and a message bridge coupled to the first processing system and the second processing system, and configured to receive one or more messages from the first processing system while the first processing system is running and forward the one or more messages to the second processing system while the second processing system is running.

One or more of the following features may be included.

The time synchronization bridge may be configured to halt and start execution of the first and second processing system so that one processing system is executing at a time. The first processing system, the second processing system, or both may be simulators. The first processing system may include a first clock, the second processing system may include a second clock, and the synchronization bridge may be configured to monitor a first number of clock cycles of the first clock while the first processing system is executing, calculate a second number of clock cycles of the second clock corresponding to the first number of clock cycles, and cause the second clock to advance by the second number of clock cycles to bring the second processing system in time synchronization with the first processing system.

BRIEF DESCRIPTION OF THE DRAWINGS

The following figures are presented for ease of illustration and explanation of the disclosed technology. They are examples and should not be construed as limitations to the scope of the claims. The scope of the claims may include some or all the embodiments shown in the figures, embodiments not shown in the figures, and/or any equivalents.

Like reference numbers in the figures denote like elements.

DETAILED DESCRIPTION

Figure 1:
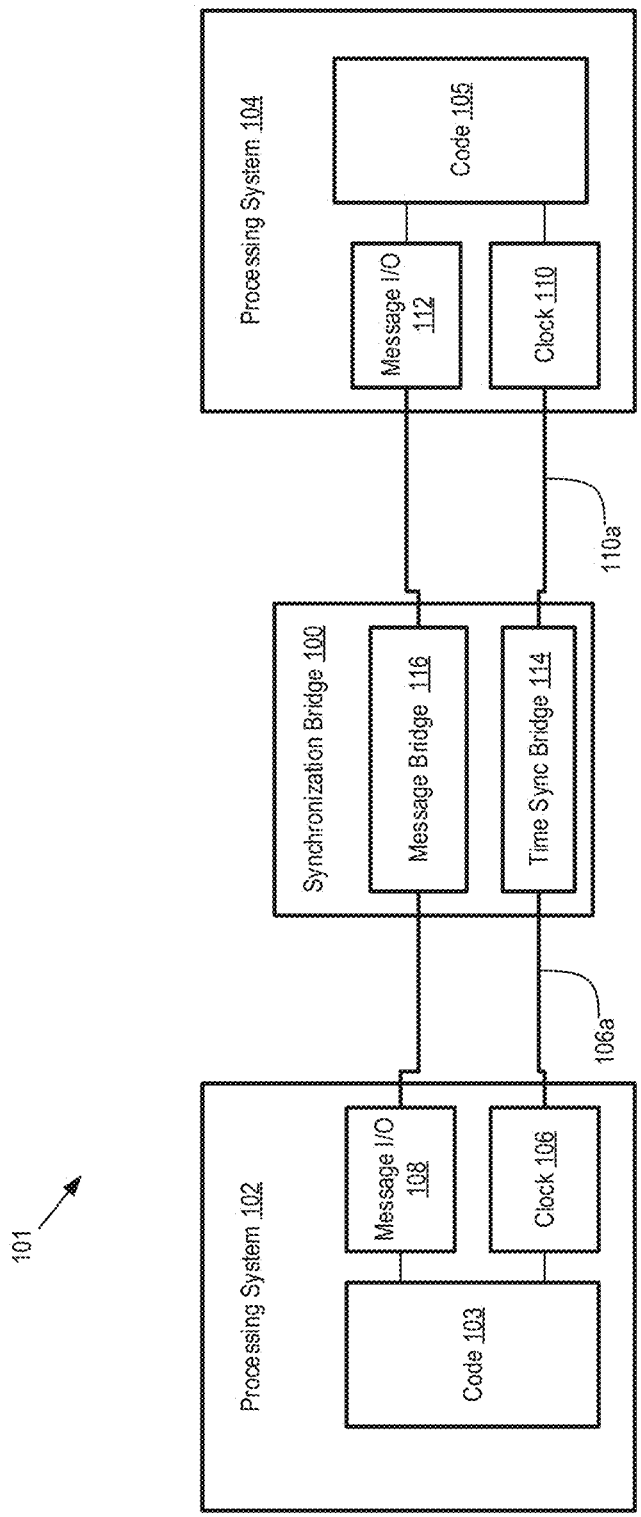
FIG. 1 is a block diagram of a system for clock and messaging synchronization.

FIG. 1 is a block diagram of a system 101 for synchronizing execution between two processing systems 102 and 104. Processing systems 102 and 104 may be simulated processing systems. For example, processing systems 102 and 104 may be virtual machines, virtual processors, language simulators, etc. that may be executing on a host computer. Processing systems 102 and 104 may execute computer code modules 103 and 105, respectively, which may contain executable computer code (such as high level code, scripts, bytecode, machine code, etc.). Processing systems 102 and 104 may also include a debugging system for stepping through computer code in computer modules 103 and 105. In such embodiments, processing systems 102 and 104 may execute software code to simulate an in-field hardware or computing system, which in turn may execute the software code. The software code executed by processing systems 102 and 104 may be final, production ready code, or it may be development code that is currently being designed and/or tested.

Processing system 102 may include a clock module 106 that may provide a simulated clock signal 106a. Clock signal 106a may be used internally by processing system 102 to drive execution of computer code module 103. Similarly, processing system 104 may include a clock module 110 that may provide a simulated clock signal 110a. Clock signal 110a may be used internally by processing system 104 to drive execution of computer code module 105. In embodiments, clock signals 106a and 110a are asynchronous—in other words, they may operate at different frequencies or phases. Clock signals 106a and 110a may be received by a time synchronization bridge 114, which may synchronize execution time of processing system 102 and processing system 104. Synchronization of timing between processing system 102 and processing system 104 will be described below in greater detail.

Processing system 102 may also include a messaging input-output (IO) module 108. IO module 108 may act as a communication interface through which computer code 103 can send messages during operation. For example, IO module 108 may implement or simulate a PCI bus, a USB bus, an Ethernet bus, a custom communication bus, or any other type of communication bus that can pass messages to and from processing system 102. IO module 108 may receive communications from executed computer code module 103 and transmit those communications to a message bridge 116. IO module 108 may also receive communication from message bridge 116 that are to be received by the executing computer code module 103.

Similarly, processing system 104 may also include a messaging input-output (IO) module 112. IO module 112 may act as a communication interface through which computer code 105 can send messages during operation. For example, IO module 112 may implement or simulate a PCI bus, a USB bus, a custom communication bus, or any other type of communication bus that can pass messages to and from processing system 104. IO module 112 may receive communications from executed computer code module 105 and transmit those communications to message bridge 116. IO module 108 may also receive communications from message bridge 116 that are to be received by computer code module 105.

In an embodiment, if computer code module 105 sends a message to be received by computer code module 103, the message may travel from computer code module 105, to IO module 112, to message bridge 116. Message bridge 116 may send the message to IO module 108 where computer code module 103 can retrieve it. If a message is to be sent in the opposite direction, from computer code module 103 to computer code module 105, the message may travel from computer code module 103, to IO module 108, to message bridge 116. Message bridge 116 may send the message to IO module 112 where computer code module 105 can retrieve it. Message bridge 116 may coordinate sending and receiving messages between computer code modules 103 and 105 to synchronize execution of the computer code modules 103 and 105, as will be discussed below in further detail.

In an embodiment, processing system 102 and processing system 104 may have different operating speeds and processing power. For example, processing system 102 may simulate or may be a more powerful processing system than processing system 104. And, as noted above, clock module 106 and clock module 110 may be asynchronous.

Moreover, processing system 102 and 104 may have different processing power and speeds than the real-world computing devices that will execute computer code modules 103 and 105. Thus, during simulation and test of computer code module 103 and/or 105, it may be beneficial to synchronize execution and messaging of processing system 102 and 104 so that the timing and messaging between processing system 102 and 104 approximates the timing and messaging between the real-world computing devices. To that end, a synchronization bridge 100 may control the executing time of and messaging between processing system 102 and 104 to simulate and approximate the messaging and timing of a real-world asynchronous system.

In an embodiment, processing system 102 may simulate an in-vehicle interface, such as a computing system that receives input from a driver of a car, a pilot of an airplane, a helmsman of a ship, etc. Processing system 104 may simulate one or more other systems of a vehicle, such as an automatic braking system, a navigation system, an airplane control system, a sensor system, a weapons system, etc. Using the example of a military plane, processing system 102 may simulate computing systems that run the cockpit and pilot interface, while processing system 104 may simulate systems such as navigation, targeting, RADAR front and electronics control, signal processing, etc. Synchronization bridge 100 may synchronize timing and messaging between the two processing systems 102 and 104 so that synchronization between the processing systems 102 and 104 matches the timing and messaging between the real-world systems they are simulating.

Figure 2:
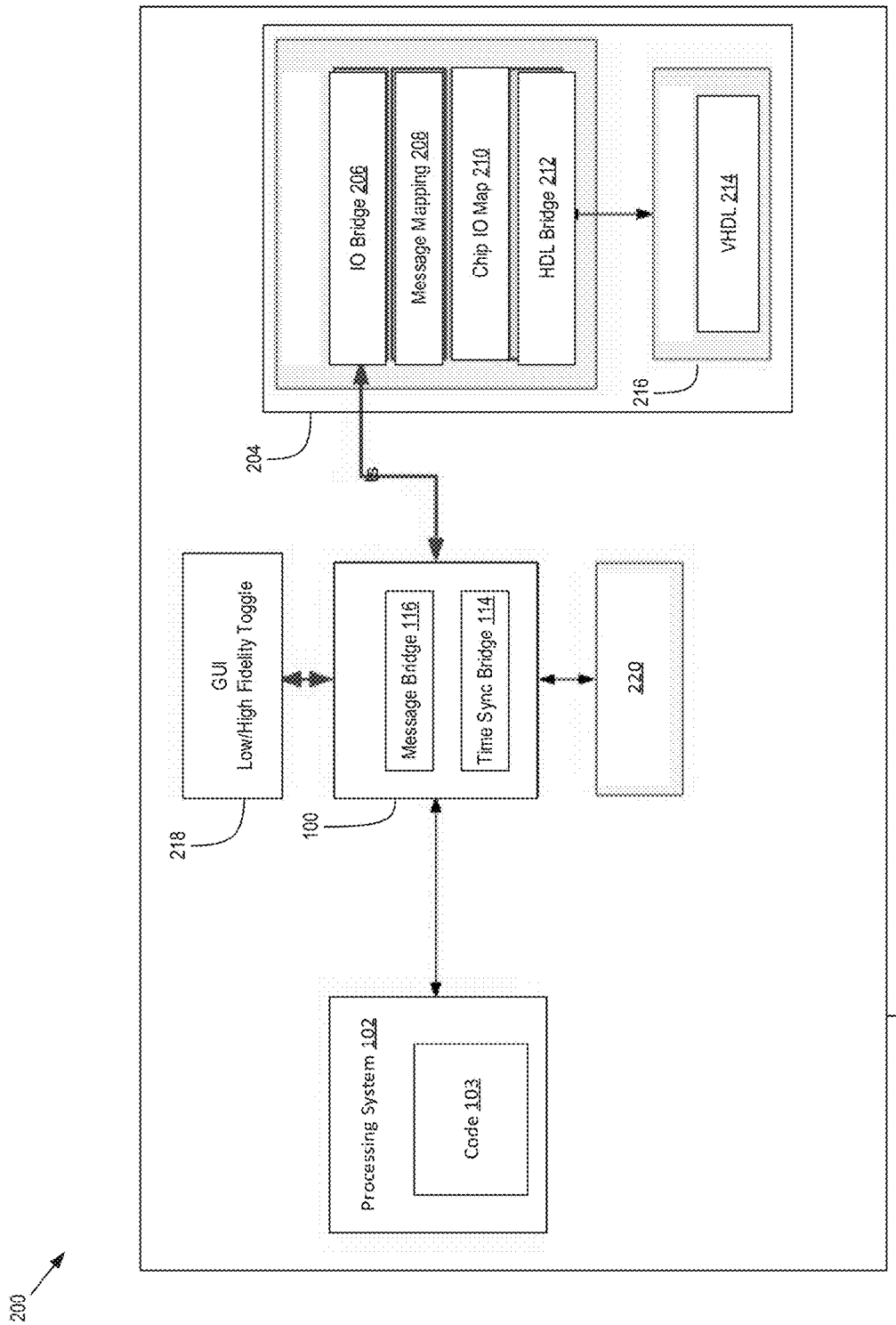
FIG. 2 is a block diagram of another embodiment of a system for clock and messaging synchronization.

Referring now to FIG. 2, system 200 may be the same as or similar to system 101 and may be an embodiment of system 101. As shown, computing device 202 may execute processing system 102, synchronization bridge 100, GUI 218, low-fidelity simulation 216, and processing system 204 (which may be the same as or similar to processing system 104). Computing device 202 may be a desktop computer, a server, or any type of computing device that can execute processing system 102, synchronization bridge 100, GUI 218, low-fidelity simulation 216, and/or processing system 204. In other embodiments, two or more computing devices may each execute one or more of processing system 102, synchronization bridge 100, GUI 218, low-fidelity simulation 216, and processing system 204, or portions of processing system 102, synchronization bridge 100, GUI 218, low-fidelity simulation 216, and processing system 204.

Processing system 204 may simulate programmable hardware, such as a field-programmable gate array (FPGA). However, in other embodiments, processing system 204 may simulate any type of hardware circuit or processing device.

Processing system 204 may include I/O bridge module 206, which may act as an interface between processing system 204 and synchronization bridge 100. IO bridge module 206 may act as an interface for messages sent to message bridge 116, and may send and receive control commands so that synchronization bridge 100 can control the execution flow of processing system 204. Control commands may include messages from processing system 204 indicating that processing system 204 is running, is idle, has executed a number of clock cycles, etc. In an embodiment, IO bridge module 206 may be implemented in the Java programming language. In other embodiments, IO bridge module 206 may be implemented in any computing language or script.

Processing system 204 may also include message mapping module 208 which may copy data elements (e.g. fields in the message format) from the incoming message to a specific message format compatible with the receiving processing system. The specific message format may include data structures, variables, registers, or other inputs expected by the recipient processing system. In embodiments, each processing system may use different data structures, variables and registers internally, but communicate with the other processing system via a common message format. Message mapping module 208 may map the fields of the incoming common message format to and/or from the correct data locations, and/or the message format, required by processing system 204. In one example, if processing system 102 is a general-purpose microprocessor executing code written in C++ and processing system 204 is an FPGA and Digital Signal Processor (DSP) (or a simulated FPGA and DSP), message mapping module 208 may map portions of a message from processing system 102 to the proper registers and memory locations (simulated or otherwise) of processing system 204. In another example, if processing system 204 generates a message to be sent to processing system 102, then message mapping module 208 may map portions of processing system 204's registers and memory locations to the message format required by processing system 102 before delivering that message to message bridge 116.

Processing system 204 may also include a chip 10 map module 210, which may define the input and output pins of the simulated FPGA chip, and map messages and signals to and from the simulated FPGA chip. Chip 10 map module 210 may, for example, translate a command from another module into a pin-level signal that can be received by the simulated FPGA, or vice versa. A hardware description language (HDL) bridge module 212 provides an interface to convert signals to and from processing system 204 to HDL compatible signals.

Processing system 204 may also include an FPGA simulator module 216 that is configured to simulate an FPGA running a Very High Speed Integrated Circuit (VHSIC) Hardware Description Language (VHDL) module 214. In other embodiments, any other hardware description languages (such as Verilog and the like) may be used. In an embodiment, FPGA simulator module 216 may use Model-Sim® simulation environment and VHDL code to simulate an FPGA. In an embodiment, IO bridge module 206, message mapping module 208, chip IO map module 201, and/or HDL Bridge 212 may be implemented in a Matlab® environment, or any other language simulator or interpreter. In other embodiments, chip IO map module 201, HDL bridge 212, FPGA simulator module 216 and VHDL module 214 may all be implemented in a Simulink® model or any other language, simulator or interpreter.

Processing system 204 may implement a high-fidelity simulation. In other words, processing system 204 may simulate an FPGA with a high degree of accuracy. Such simulations may require relatively large amount of processing time and processing power. Thus, system 200 may also include a low-fidelity simulation module 220 and a graphical user interface (GUI) module 218. Because low-fidelity simulation module 220 uses less processing cycles and less time to run, it may be used as a less detailed simulation when desired. In an embodiment, GUI module 218 can send a signal to synchronization bridge 100 to toggle between low-fidelity simulation module 220 and processing system 204. In other embodiments, the signal instructing synchronization bridge 100 to toggle between the high- and low-fidelity simulations may come from a source other than GUI module 218 including, for example, an automated software module, processing system 102 or 204, or any other module or device that can produce a signal to toggle between high- and low-fidelity simulations.

To switch to low-fidelity simulations, synchronization bridge 100 may halt or idle processing system 204 and execute low-fidelity simulation module 220. To switch back to high-fidelity simulation, synchronization bridge 100 may halt or idle low-fidelity simulation module 220 and execute processing system 204. While low-fidelity simulation module 220 is running, synchronization bridge 100 may forward messages between processing system 102 and low-fidelity simulation module 220 rather than between processing system 102 and processing system 104. In addition, in certain embodiments, no time synchronization is needed during low-fidelity simulation. In this case, processing system 102 may run at full speed without being halted and any messages from processing system 102 may be processed immediately by low-fidelity simulation module 220. In embodiments, low-fidelity simulation module 220 may process incoming messages simply by responding with an acknowledgement message to indicate an OK status.

As an example, a simulation of an airplane's flight may include long periods of cruising at altitude and other periods of interest, such as encounters with other aircraft, taking off, landing, etc. A user may use GUI module 218 to send a signal to toggle between low-fidelity simulation module 220 and processing system 204, so that system 200 uses low-fidelity simulation module 220 to simulate the FPGA during cruising times, and to use processing system 204 to simulate the FPGA during periods of interest. This can reduce the total time for simulating and testing by speeding up the simulation when low-fidelity simulation module 220 is used.

Figure 3:
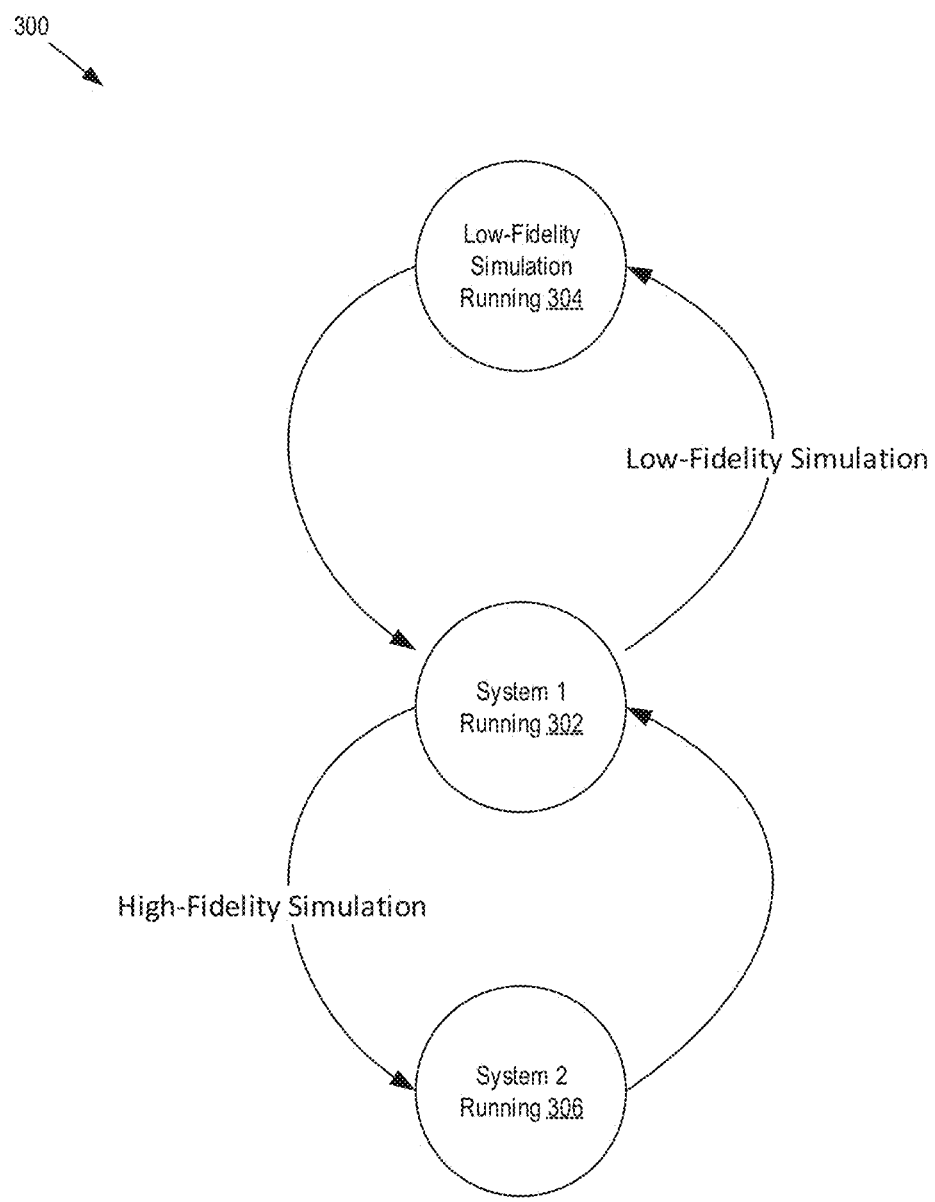
FIG. 3 is a block diagram of another embodiment of a system for clock and messaging synchronization.

FIG. 3 is a state machine 300 illustrating a simplified operation of the system 200 shown in FIG. 2. In an embodiment, system 200 may alternate executing processing system 102 and processing system 204. In state 302, the first processing system (e.g. processing system 102) may be executing. After several clock cycles have been executed by processing system 102, or after a message has been received from processing system 102 indicating that it has completed processing and has become idle, system 200 may enter state 306, where the second processing system (e.g. processing system 204) executes. In state 306, execution of the first processing system may be paused. Alternatively, the first processing system may be idling or in a waiting state. After several clock cycles have been executed by processing system 204, or after a message has been received from processing system 204 indicating that it has completed processing and has become idle, system 200 may return to state 302 where the first processing system executes and the second processing system is paused, idle, or waiting. During execution, system 200 may switch between states 302 and 306 to keep execution of the first and second processing systems (e.g. processing system 102 and 204) synchronized.

If the low-fidelity simulation is to be used, as described above, system 200 may switch between states 302 and 304. In state 304, low-fidelity simulation module 220 may be used to execute the low-fidelity simulation, as described above. While the low-fidelity simulation module is executing, the first processing system (e.g. processing system 102) and the second processing system (e.g. processing system 204) may be halted (with no clock running), idle, or waiting.

Figure 4:
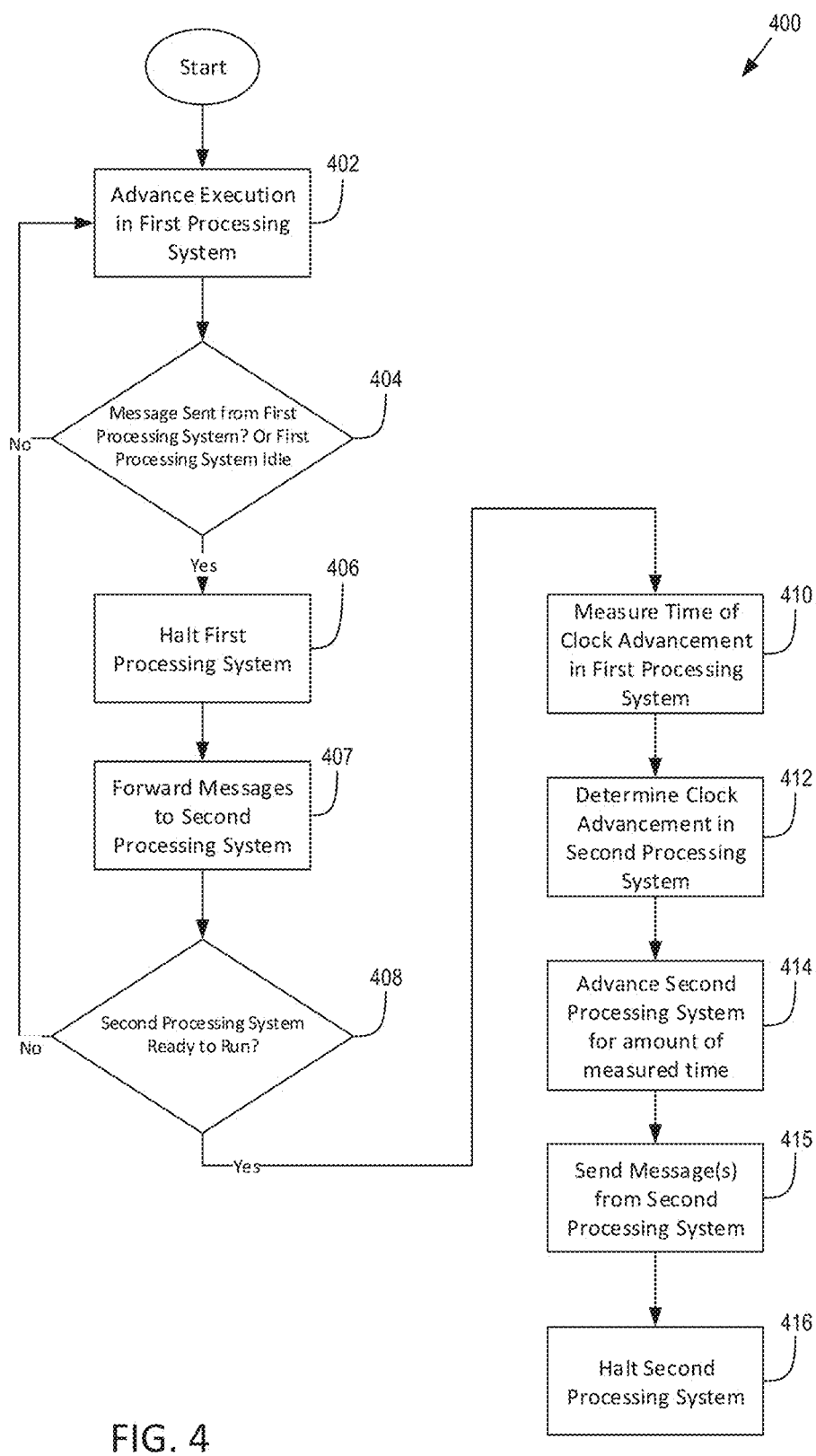
FIG. 4 is a flow chart of a process for clock and messaging synchronization.

Referring to FIG. 4, a flowchart illustrates a process 400 for time and messaging synchronization between two processing systems. Referring also to FIG. 2 as an example, process 400 may describe synchronization between processing system 102 and processing system 204. Although process 400 illustrates time and messaging synchronization between two processing systems, process 400 and similar processes may be used to synchronize time and messaging between more than two processing systems.

In box 402, the first processing system (e.g. processing system 102) executes for several clock cycles. In embodiments, processing system 102 may include a feature, such as a hardware or software-based counter, that counts the number of clock cycles of clock 106 during execution, and can communicate the measured number of clock cycles to synchronization bridge 100. Synchronization bridge 100 may also have a feature that detects when processing system 102 reaches an idle state i.e. a state where processing system 102 is not processing jobs and/or is waiting for input from a user or from processing system 204. For example, processing system 102 may send a signal or a message to synchronization bridge 100 indicating that processing system 102 is idle.

Process 400 may continue executing until, in box 404, the first processing system sends a message to the second processing system via the synchronization bridge 100 and/or the first processing system becomes idle. If no message has been sent and/or the first processing system is not idle, execution may continue in box 402. If a message has been sent to synchronization bridge 100 or the first processing system is idle, process 400 may halt the first processing system in box 406. Halting the first processing system may include stopping execution of the first processing system so that its clock, i.e., clock 106, is no longer running.

In box 407, any messages sent by the first processing system to the second processing system may be forwarded to the second processing system. As discussed above, message synchronization bridge 116 may receive messages from processing system 102 and forward them to processing system 204, where they can be processed.

In box 408, the process may determine if the second processing system (e.g. processing system 204) is ready to run. The second processing system may be ready to run if, for example, one or more messages are queued in synchronization bridge 100. If processing system 204 is ready to process the messages, it may send a signal to synchronization bridge 100 indicating that it is ready to execute and process the messages. In other embodiments, synchronization bridge 100 may forward messages from processing system 102 to processing system 204 as the messages are received, and wait for a signal from processing system 102 indicating that it is idle. Again, in this scenario, if processing system 204 is ready to process the messages, it may send a signal to synchronization bridge 100 indicating that it is ready to execute and process the messages.

In addition, the second processing system may send a message to synchronization bridge 100 indicating that the second processing system is ready to run or is not ready to run. If the second processing system is not ready to run (for example if there is no message or input received by the second processing system that needs to be processed), process 200 may return to box 402 to continue execution of the first processing system by, for example, restarting clock 106. If the second processing system is ready to run, process 400 may continue to box 410.

In box 410, processing system 102 and/or synchronization bridge 100 may measure the time of executing of the first processing system. As noted above, processing system 102 may count the number of clock cycles during execution. The number of clock cycles may be stored in a counter, for example, and forwarded to synchronization bridge 100. When processing system 102 is halted, synchronization bridge 100 may retrieve the number of clock cycles that took place during the most recent period of execution. Because the number of clock cycles and the frequency of processing system 102's clock 106 in FIG. 1) is known, synchronization bridge 100 can determine the amount of execution time that has passed.

In box 412, synchronization bridge may determine the number of clock cycles that the second processing system (e.g. processing system 204) should be advanced to catch up to the first processing system (e.g. processing system 102). Because the amount of time and the frequency of processing system 204's clock (which may be the same as or similar to clock 110 in FIG. 1) is known, synchronization bridge 100 can determine the number of clock cycles that processing system 204 should execute so that it is brought into synchronization with processing system 102.

As an example, assume that the processing system 100's clock 106 runs at 1.2 MHz and processing system 102 executed 1000 clock cycles. In box 410, process 400 may calculate that, to execute 1000 clock cycles, processing system 102 ran for 833 micro-seconds. Assume also that processing system 204's simulated clock 110 runs at 800 kHz. In this case, process 400 may determine that processing system 204 should execute 567 clock cycles so that it, also, executes for 833 micro-seconds. Typical clock rates may be between about 1.5 GHz and about 3.0 GHz for general-purpose microprocesss; and between about 100 MHz to about 1 GHz and higher for FPGAs.

In other embodiments, instead of forwarding the number of clock cycles to synchronization bridge 104, processing systems 102 and 204 may calculate the amount of time that has passed during execution, and forward the amount of time to synchronization bridge 100. Synchronization bridge 100 may then issue a command to the other processing system instructing it to run for the specified time. Upon receipt of the specified time, processing systems 102 and 104 may calculate the number of clock cycles necessary to run for the specified time, and may subsequently run for the calculated number of clock cycles.

In box 414, process 400 may result in issuing of a command (for example, from synchronization bridge 100 to processing system 204) to execute for the determined number of clock cycles—in the example above, the command may instruct processing system 204 to execute for 567 clock cycles. After processing system 204 executes for the determined number of clock cycles, processing system may send a message to synchronization bridge 100 to indicate that the execution is complete.

While processing system 204 is executing, processing system 204 may generate messages to be received by processing system 102. These messages may be queued in messaging synchronization bridge 116, or may be immediate forwarded by messaging bridge 116 to processing system 102, as described above.

Once execution is complete, process 400 may halt execution of system 204 in box 416. The process may then continue by returning to box 402.

After the second processing system's execution is complete, the first and second processing systems process 400 may be time-synchronized. In other words, each may have reached the same point in time the simulation. In a real-world system, both systems will be running simultaneously. In simulation, however, processing systems 102 and 204 may run their respective simulations at different speeds. For example, processing system 102 may perform its simulation faster than processing system 204. If both simulations could run at full speed, they would not be time synchronized with respect to each other, and proper communication between the two systems could be compromised. By controlling the execution as described above, process 400 may keep process systems 102 and 204 in time synchronization with each other so that the two asynchronous systems can perform a joint simulation with synchronized execution time and messaging.

The example shown in process 400 operates so that the first processing system executes, then the second processing system executes to catch up to the first processing system. One skilled in the art will recognize that, in other embodiments, the second processing system could execute, then the first processing system can be executed to catch up to the second processing system. In other embodiments, the processing systems may leap-frog executing, where one processing system catches up, then goes beyond the execution of the other processing system. In other embodiments, system 200 may alternate between any combination of these options, having one processing system execute then the other, so that they remain in time and messaging synchronization.

Although process 400 illustrates synchronization between two processing systems, the process could also be used to synchronize more than two processing systems. For example, in the case of three processing systems, the first processing system may run while the second and third are idle. Subsequently, synchronization bridge may run the second and/or third processing systems to synchronize timing and messaging between the three processing systems. In other examples, synchronization between processing systems may be applied to any number of processing systems.

In other embodiments, variations of process 400 may be used. For example, synchronization bridge 100 may instruct the first system (e.g. processing system 102) to run for a certain amount of time or a certain amount of clock cycles. As processing system 102, it may send out one or more messages that are received by messaging synchronization bridge 116, and are forwarded to the second processing system (e.g. processing system 204). If processing system 204 is ready to run, for example if it has received sufficient inputs from the first system, then the processing system 204 informs synchronization bridge 100 that it is ready to process. At this point, synchronization bridge may instruct the processing system 204 to run.

As processing system 204 runs, it may send one or more messages to the processing system 102. When processing system 102 has sufficient inputs from processing system 204, it may send a signal to synchronization bridge 100 indicating it is ready to process. Synchronization bridge 100 may then instruct processing system 102 to run. As each processing system runs, synchronization bridge 100 receives the amount of time (and/or number of clock cycles) for each run and instructs the processing system that is behind to run until it is caught up with the other.

Figure 5:
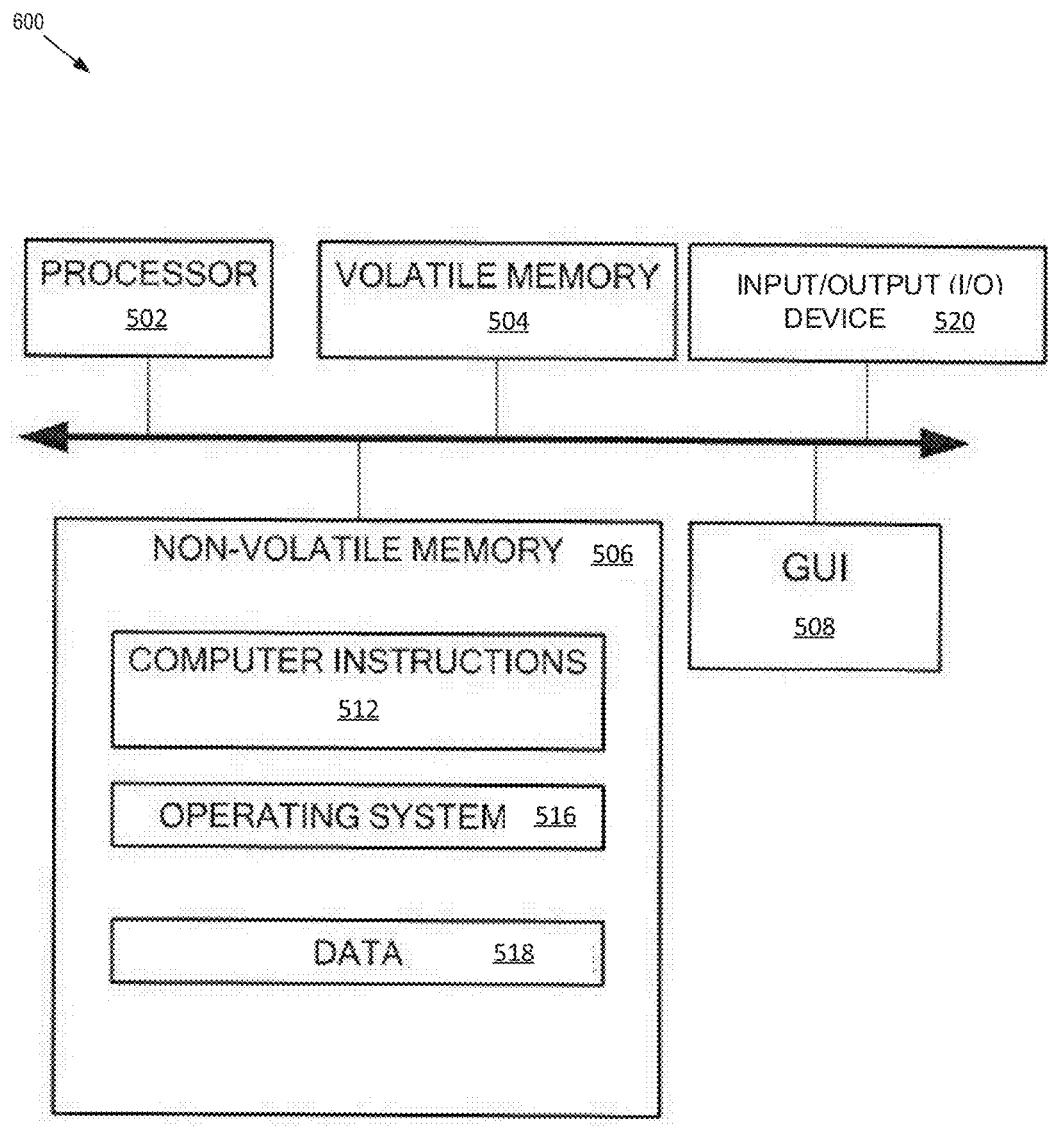
FIG. 5 is a block diagram of a computing system.

Referring to FIG. 5, in some embodiments, systems 100 and 200 (or any other systems described in this disclosure) may be implemented, in whole or in part, as one or more computers or coupled to one or more separate computers, such as computer 500. Computer 500 may include processor 502, volatile memory 504 (e.g., RAM), non-volatile memory 506 (e.g., a hard disk drive, a solid-state drive such as a flash drive, a hybrid magnetic and solid state drive, etc.), graphical user interface (GUI) 508 (e.g., a display or touchscreen, etc.) and input/output (I/O) device 520 (e.g., a mouse, a keyboard, a touchscreen, and so forth). Non-volatile memory 506 stores computer instructions 512, an operating system 516 and data 518 such that, for example, the computer instructions 512 are executed by the processor 502 out of volatile memory 504 to perform at least a portion of processes 400. Program code may be applied to data entered using an input device of GUI 508 or received from I/O device 520.

In embodiments, processing system 102 and/or 104 may be executed by computer 500. For example, if processing system 102 and 104 are virtual machines, those machines may run on a computing device such as computer 500. In addition, synchronization bridge 100 may be implemented as software executed by a computing device such as computer 500. Processes 400 may also be implemented by a computing device such as computer 500. For example, if processing system 102, processing system 104, and synchronization bridge are running on computer 500, they may perform some or all the steps of processes 400.

The processes described above are not limited to use with the hardware and software of FIG. 5 and may find applicability in any computing or processing environment and with any type of machine or set of machines that can run a computer program. The processes described above may be implemented in hardware, software, or a combination of the two.

The processes are not limited to the specific embodiments described. For example, process 400 is not limited to the specific processing order shown in FIG. 4. Rather, any of the blocks may be re-ordered, combined, or removed, or performed in parallel or in serial, as necessary, to achieve the desired results.

Processor 502 may be implemented by one or more programmable processors executing one or more computer programs to perform the functions of the system. As used herein, the term "processor" describes an electronic circuit that performs a function, an operation, or a sequence of operations. The function, operation, or sequence of operations may be hard coded into the electronic circuit or soft coded by way of instructions held in a memory device. A "processor" may perform the function, operation, or sequence of operations using digital values or using analog signals. In some embodiments, the "processor" can be embodied in processing devices including, for example, a general purpose microprocessor, a digital signal processor (DSP), a reduced instruction set computer (RISC), a complex instruction set computer (CISC), an application specific integrated circuit (ASIC), a field programmable gate array (FPGA), a system on chip (SOC), a programmable logic array (PLA), a microcontroller, an embedded controller, a multi-core processor, and/or others, including combinations of the above. In some embodiments, the "processor" may be embodied in a microprocessor with associated program memory. In some embodiments, the "processor" may be embodied in a discrete electronic circuit. The "processor" may be analog, digital or mixed-signal. In some embodiments, the "processor" may be one or more physical processors or one or more "virtual" (e.g., remotely located or "cloud") processors.

When implemented on a processing device, the program code segments combine with the processor to provide a unique device that operates analogously to specific logic circuits. Described embodiments may be implemented as an electronic circuit, an integrated circuit, a multi-chip module, a single card, or a multi-card circuit pack. Further, as would be apparent to one skilled in the art, various functions of circuit elements may also be implemented as processing blocks in a software program. Such software may be employed in, for example, a digital signal processor, microcontroller, or general purpose computer. Thus, described embodiments may be implemented in hardware, a combination of hardware and software, software, or software in execution by one or more processors.

Some embodiments may be implemented in the form of methods and apparatuses for practicing those methods. Described embodiments may also be implemented in the form of program code, for example, stored in a storage medium, loaded into and/or executed by a machine, or transmitted over some transmission medium or carrier, such as over electrical wiring or cabling, through fiber optics, or via electromagnetic radiation. Described embodiments may also be implemented in the form of a bit stream or other sequence of signal values electrically or optically transmitted through a medium, and/or stored magnetic-field variations in a magnetic recording medium that may be generated using a method and/or an apparatus as described herein. A non-transitory machine-readable medium may include one or more tangible storage media and/or one or more "virtual" (e.g., remotely located or "cloud") storage media. A non-transitory machine-readable medium may include storage devices such as magnetic recording media including hard drives, floppy diskettes, and magnetic tape media, optical recording media including compact discs (CDs) and digital versatile discs (DVDs), solid state memory such as flash memory, hybrid magnetic and solid state memory, non-volatile memory, volatile memory, and so forth, but does not include a transitory signal per se. When embodied in a non-transitory machine-readable medium, and the program code is loaded into and executed by a machine, such as a computer, the machine becomes an apparatus for practicing the method.

Various elements, which are described in the context of a single embodiment, may also be provided separately or in any suitable sub-combination. It will be further understood that various changes in the details, materials, and arrangements of the parts that have been described and illustrated herein may be made by those skilled in the art without departing from the scope of the following claims.

The invention claimed is:

1. A system comprising:
a first simulated processing system having a first clock;
a second simulated processing system having a second clock, wherein the first and second processing systems operate asynchronously; and
a synchronization bridge to coordinate executing of the first synchronized processing system and the second synchronized processing system to synchronize the time of execution of the first and second simulated processing systems;
wherein the synchronization bridge is configured to receive a message from the first simulated processing system directed to the second simulated processing system, forward the message to the second simulated processing system, and receive a message from the second simulated processing system indicating whether the second simulated processing system is ready to process the message;
wherein the second simulated processing system indicates the second simulated processing system is ready to process the message if the second simulated processing system has received sufficient inputs from the first simulated processing system;
wherein the synchronization bridge instructs the second simulated processing system to run for a second number of clock cycles in response to receiving the message from the second simulated processing system indicating that the second simulated processing system is ready to process the message.

2. The system of claim 1 wherein the synchronization bridge is further configured to receive, from the first simulated processing system, an amount of time of execution of the first processing system.

3. The system of claim 2 wherein the synchronization bridge is configured to instruct the second simulated processing system to run for at least the amount of time received from the first processing system.

4. The system of claim 1 wherein the system is further configured to determine an amount of time associated with a number of clock cycles executed by the first processing system.

5. The system of claim 4 wherein the system is further configured to determine the second number of clock cycles of the second clock associated with the determined amount of time.

6. The system of claim 1 wherein the synchronization bridge is configured to receive, from the first and/or second simulated processing system, a message indicating whether the first and/or second simulated processing system is running or idle.

7. The system of claim 6 wherein on receipt of the message indicating that the first simulated processing system is idle, the synchronization bridge is configured to instruct the second processing system to run, and on receipt of the message indicating that the second simulated processing system is idle, the synchronization bridge is configured to instruct the first processing system to run.

8. The system of claim 1 wherein the first simulated processing system, the second simulated processing system, and the synchronization bridge run on a common computing system.

9. The system of claim 1 wherein the system comprises a simulation toggle that selectively causes at least one of the first and the second simulated processing systems to run in a low-fidelity mode or a high-fidelity mode.

10. The system of claim 1 wherein the message is a communication bus message.

11. A method for time synchronization of asynchronously running processing systems comprising:
   executing, by one or more computing devices, a first simulated processing system, having a first simulated clock, for a first number of clock cycles of the first simulated clock; and
   executing, by the one or more computing devices, a second simulated processing system, having a second simulated clock, for a second number of clock cycles of the second simulated clock, wherein the first number of clock cycles of the first simulated clock and the second number of clock cycles of the second simulated clock correspond to a common execution time;
   forwarding messages between the first and second simulated processing systems comprising:
   receiving a message from the first simulated processing system directed to the second simulated processing system;
   forwarding the message to the second simulated processing system; and
   receiving a message from the second simulated processing system indicating whether the second simulated processing system is ready to process the message,
   wherein the second simulated processing system indicates the second simulated processing system is ready to process the message if the second simulated processing system has received sufficient inputs from the first simulated processing system;
   wherein the executing of the second simulated processing system is performed base on an instruction from the synchronization bridge in response to receiving the message indicating that the second simulated processing system is ready to process the message.

12. The method of claim 11 further comprising controlling the execution of the first and second simulated processing systems by a synchronization bridge executed by the computing system.

13. The method of claim 12 wherein the synchronization bridge is configured to determine the execution time based on the first number of clock cycles of the first simulated processing system.

14. The method of claim 13 further comprising determining, by the synchronization bridge, the second number of clock cycles of the second clock associated with the execution time.

15. The method of claim 14 further comprising instructing, by the synchronization bridge, the second simulated processing system to run for at least the second number of clock cycles.

16. The method of claim 12 further comprising:
   receiving, by the synchronization bridge, a message from the first and/or second simulated processing system indicating that the first and/or second processing system is running;
   receiving, by the synchronization bridge, a message form the first and/or second simulated processing system indicating that the first and/or second simulated processing system is idle;
   instructing, by synchronization bridge, the second processing system to run in response to receiving the message indicating that the first simulated processing system is idle; and
   instructing, by synchronization bridge, the first processing system to run in response to receiving the message indicating that the second simulated processing system is idle.

17. A synchronization bridge for synchronizing executing between two processing systems comprising:
   a time synchronization bridge coupled to a first processing system and a second processing system, and configured to halt and start execution of the first and second processing systems to maintain time synchronization between the first and second processing systems; and
   a message bridge coupled to the first processing system and the second processing system, and configured to receive one or more messages from the first processing system while the first processing system is running and forward the one or more messages to the second processing system prior to starting execution of the second processing system,
   wherein the synchronization bridge halts the execution of the first processing system in response to receiving the one or more messages from the first processing system, and starts execution of the second processing system for a second number of clock cycles in response to the message bridge receiving a message from the second processing system indicating that the second processing system is ready to process the one or more messages, and
   wherein the second processing system indicates the second processing system is ready to process the one or more messages if the second processing system has received sufficient inputs from the first simulated processing system through the message bridge.

18. The synchronization bridge of claim 17 wherein the time synchronization bridge is configured to halt and start execution of the first and second processing system so that one processing system is executing at a time.

19. The synchronization bridge of claim 17 wherein the first processing system, the second processing system, or both are simulators.

20. The synchronization bridge of claim 17 wherein the first processing system comprises a first clock, the second processing system comprises a second clock, and the synchronization bridge is further configured to monitor a first number of clock cycles of the first clock while the first processing system is executing, calculate the second number of clock cycles of the second clock corresponding to the first number of clock cycles, and cause the second clock to advance by the second number of clock cycles to bring the second processing system in time synchronization with the first processing system.

21. A system comprising:
a first simulated processing system having a first clock;
a second simulated processing system having a second clock, wherein the first and second processing systems operate asynchronously; and
a synchronization bridge to coordinate executing of the first synchronized processing system and the second synchronized processing system to synchronize the time of execution of the first and second simulated processing systems,
wherein the synchronization bridge is configured to receive a message from the first simulated processing system directed to the second simulated processing system, forward the message to the second simulated processing system, and receive a message from the second simulated processing system indicating whether the second simulated processing system is ready to process the message,
wherein the synchronization bridge, in response to receiving the message from the second simulated processing system indicating that the second simulated processing system is ready to process the message:
determines an amount of time associated with a number of clock cycles executed by the first processing system;
determines a second number of clock cycles clock associated with the determined amount of time; and
instructs the second simulated processing system to run for the second number of clock cycles.

22. The system of claim 21 wherein the synchronization bridge is further configured to receive, from the first simulated processing system, an amount of time of execution of the first processing system.

23. The system of claim 21 wherein the synchronization bridge is configured to instruct the second simulated processing system to run for at least the amount of time received from the first processing system.

24. The system of claim 21 wherein the synchronization bridge is configured to receive, from the first and/or second simulated processing system, a message indicating whether the first and/or second simulated processing system is running or idle.

25. The system of claim 24 wherein on receipt of the message indicating that the first simulated processing system is idle, the synchronization bridge is configured to instruct the second processing system to run, and on receipt of the message indicating that the second simulated processing system is idle, the synchronization bridge is configured to instruct the first processing system to run.

26. The system of claim 21 wherein the first simulated processing system, the second simulated processing system, and the synchronization bridge run on a common computing system.

27. The system of claim 21 wherein the system comprises a simulation toggle that selectively causes at least one of the first and the second simulated processing systems to run in a low-fidelity mode or a high-fidelity mode.

28. The system of claim 21 wherein the message is a communication bus message.

29. A method for time synchronization of asynchronously running processing systems comprising:

executing, by one or more computing devices, a first simulated processing system, having a first simulated clock, for a first number of clock cycles of the first simulated clock; and
executing, by the one or more computing devices, a second simulated processing system, having a second simulated clock, for a second number of clock cycles of the second simulated clock, wherein the first number of clock cycles of the first simulated clock and the second number of clock cycles of the second simulated clock correspond to a common execution time;
forwarding messages between the first and second simulated processing systems comprising:
receiving a message from the first simulated processing system directed to the second simulated processing system;
forwarding the message to the second simulated processing system; and
receiving a message from the second simulated processing system indicating whether the second simulated processing system is ready to process the message,
wherein in response to receiving the message indicating that the second simulated processing system is ready to process the message:
determining, by the synchronization bridge, the execution time based on the first number of clock cycles of the first simulated processing system;
determining, by the synchronization bridge, the second number of clock cycles of the second clock associated with the execution time; and
instructing, by the synchronization bridge, the second simulated processing system to run for at least the second number of clock cycles;
wherein the executing of the second simulated processing system is performed based on the instructing by the synchronization bridge.

30. The method of claim 29 further comprising controlling the execution of the first and second simulated processing systems by a synchronization bridge executed by the computing system.

31. The method of claim 29 further comprising:
receiving, by the synchronization bridge, a message from the first and/or second simulated processing system indicating that the first and/or second processing system is running;
receiving, by the synchronization bridge, a message form the first and/or second simulated processing system indicating that the first and/or second simulated processing system is idle;
instructing, by synchronization bridge, the second processing system to run in response to receiving the message indicating that the first simulated processing system is idle; and
instructing, by synchronization bridge, the first processing system to run in response to receiving the message indicating that the second simulated processing system is idle.

32. A synchronization bridge for synchronizing executing between two processing systems comprising:
a time synchronization bridge coupled to a first processing system and a second processing system, and configured to halt and start execution of the first and second processing systems to maintain time synchronization between the first and second processing systems; and
a message bridge coupled to the first processing system and the second processing system, and configured to receive one or more messages from the first processing system while the first processing system is running and forward the one or more messages to the second processing system prior to starting execution of the second processing system, wherein the synchronization bridge halts the execution of the first processing system in response to receiving the one or more messages from the first processing system, and starts execution of the second processing system in response to the message bridge receiving a message from the second processing system indicating that the second processing system is ready to process the one or more messages, and wherein the first processing system comprises a first clock, the second processing system comprises a second clock, and the synchronization bridge is further configured to monitor a first number of clock cycles of the first clock while the first processing system is executing, calculate a second number of clock cycles of the second clock corresponding to the first number of clock cycles, and cause the second clock to advance by the second number of clock cycles to bring the second processing system in time synchronization with the first processing system.

33. The synchronization bridge of claim 32 wherein the time synchronization bridge is configured to halt and start execution of the first and second processing system so that one processing system is executing at a time.

34. The synchronization bridge of claim 32 wherein the first processing system, the second processing system, or both are simulators.

* * * * *